(12) United States Patent
Sato et al.

(10) Patent No.: US 10,002,785 B2
(45) Date of Patent: Jun. 19, 2018

(54) AIR-GAP ASSISTED ETCH SELF-ALIGNED DUAL DAMASCENE

(71) Applicant: Microchip Technology Incorporated, Chandler, AZ (US)

(72) Inventors: Justin Hiroki Sato, West Linn, OR (US); Andrew Alexander Taylor, Portland, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days. days.

(21) Appl. No.: 14/735,425

(22) Filed: Jun. 10, 2015

(65) Prior Publication Data

US 2015/0380298 A1    Dec. 31, 2015

Related U.S. Application Data

(60) Provisional application No. 62/018,353, filed on Jun. 27, 2014.

(51) Int. Cl.
  *H01L 21/768* (2006.01)

(52) U.S. Cl.
  CPC .. *H01L 21/76813* (2013.01); *H01L 21/76807* (2013.01); *H01L 21/76843* (2013.01); *H01L 21/76871* (2013.01); *H01L 2221/1031* (2013.01)

(58) Field of Classification Search
  CPC ......... H01L 21/76813; H01L 21/76843; H01L 21/76871; H01L 2221/1031
  See application file for complete search history.

(56) References Cited

U.S. PATENT DOCUMENTS

| 5,920,790 | A | 7/1999 | Wetzel et al. ................. 438/618 |
| 6,261,949 | B1 * | 7/2001 | Sukekawa ......... H01L 21/76808 257/750 |
| 6,548,900 | B1 | 4/2003 | Kusumi ....................... 257/758 |
| 6,737,350 | B1 * | 5/2004 | Akahori ............ H01L 21/31116 257/E21.252 |
| 2003/0054629 | A1 * | 3/2003 | Kawai ............... H01L 21/76804 438/622 |
| 2004/0198055 | A1 | 10/2004 | Wang ........................... 438/692 |

FOREIGN PATENT DOCUMENTS

| EP | 1120822 A1 | 8/2001 | ........... H01L 21/302 |
| GB | 2336243 A | 10/1999 | ......... H01L 21/3205 |

OTHER PUBLICATIONS

International Search Report and Written Opinion, Application No. PCT/US2015/037880, 12 pages, dated Sep. 30, 2015.

* cited by examiner

*Primary Examiner* — Phat X Cao
*Assistant Examiner* — Victor Barzykin
(74) *Attorney, Agent, or Firm* — Slayden Grubert Beard PLLC

(57) ABSTRACT

A semiconductor process for providing a metal layer uses the following steps: A barrier dielectric layer is deposited on a semiconductor layer comprising an exposed metal line. A via layer is formed on top of the barrier dielectric layer comprising at least one via. A non-conformal film is deposited on top of the via layer thereby forming a void in the at least one via, and at least one trench is etched into the non-conformal film thereby opening the void, and creating a dual-damascene layer.

21 Claims, 6 Drawing Sheets

FIB/SEM imaging post etch

AIR-GAP ASSISTED ETCH SELF-ALIGNED DUAL DAMASCENE

RELATED PATENT APPLICATION

This application claims priority to commonly owned U.S. Provisional Patent Application No. 62/018,353; filed Jun. 27, 2014; which is hereby incorporated by reference herein for all purposes.

TECHNICAL FIELD

The present disclosure relates to semiconductor manufacturing method and processes, in particular to air-gap assisted etch self-aligned dual-Damascene process.

In a dual-Damascene semiconductor manufacturing process, an underlying silicon oxide insulating layer is patterned with open trenches where the conductor should be. A thick coating of copper that significantly overfills the trenches is deposited on the insulator, and chemical-mechanical planarization (CMP) is used to remove the copper that extends above the top of the insulating layer. Copper sunken within the trenches of the insulating layer is not removed and becomes the patterned conductor. Damascene processes generally form and fill a single feature with copper per Damascene stage. Dual-Damascene processes generally form and fill two features with copper at once, e.g., a trench overlying a via may both be filled with a single copper deposition using dual-Damascene. With successive layers of insulator and copper, a multilayer (5-10 metal layers or more) interconnection structure can be created.

SUMMARY

Working on a Self-Aligned Dual Damascene process, it was observed that the higher k dielectric was causing RC delay/yield problems with the higher speed parts. Therefore, there is a need for an improved process.

According to various embodiments, a semiconductor process for providing a metal layer, may comprise the steps of: depositing a barrier dielectric layer on a semiconductor layer comprising an exposed metal line; forming a via layer on top of the barrier dielectric layer comprising at least one via; depositing a non-conformal film on top of the via layer thereby forming a void in the at least one via; and etching at least one trench into the non-conformal film thereby opening the void, and creating a dual-damascene layer.

According to a further embodiment, the semiconductor manufacturing process may further comprise: depositing a copper layer on top of the dual-damascene layer and removing an overburden copper layer. According to a further embodiment, the step of depositing the copper layer may comprise: depositing a conductive barrier layer followed by a copper seed layer. According to a further embodiment, the step of removing the overburden copper layer can be performed by a chemical mechanical polish process. According to a further embodiment, prior to depositing the copper layer, an in-situ ash process can be performed. According to a further embodiment, after the in-situ ash process the barrier dielectric layer can be opened within the at least one via. According to a further embodiment, a front-side wet cleaning step can be performed before depositing the copper layer. According to a further embodiment, the barrier dielectric layer may consist of SiN or SiC. According to a further embodiment, the step of forming the via layer may comprise: depositing an inter-metal dielectric layer on top of the barrier dielectric layer; depositing and patterning the via layer; and pre-etching a via up to the barrier dielectric. According to a further embodiment, the via layer may comprise an anti-reflective coating followed by a photoresist layer. According to a further embodiment, etching can be performed with a soft-landing endpoint. According to a further embodiment, the non-conformal film can be a dielectric film comprising undoped silicate glass (USG), fluorosilicate glass (FSG) or a material with a small dielectric constant relative to silicon dioxide. According to a further embodiment, the step of etching the non-conformal film may comprise: depositing a hard mask layer on top of the non-conformal film; printing a trench layer using photolithography; and etching the trench layer. According to a further embodiment, etching the trench layer may comprise an etch sequence that etches through the trench layer and the hard mask layer. According to a further embodiment, the etch sequence may initiate an oxide etch which opens the void. According to a further embodiment, the oxide etch may be monitored by an endpoint system. According to a further embodiment, the oxide etch may be monitored by a timed process. According to a further embodiment, a pre-defined amount of over-etching can be performed to clear all oxide from atop the barrier dielectric layer. According to a further embodiment, at the end of the etch sequence, a barrier etch can be performed to open a bottom of the via to the metal line. According to a further embodiment, the process can be repeated to form a necessary number of metal layers.

DETAILED DESCRIPTION

According to various embodiments, it has been discovered that an air-gap void formed during manufacturing can be exploited and used as an etch-assist. Thus, an initially unwanted parasitic effect can be beneficially used. According to various embodiments, this method can, for example, be further pushed to try and utilize it to solve budgetary and equipment requirement problems that many semiconductor fabrication plants are being faced with. The air-gap can be formed using very non-conformal depositions. Many conventional, however, advanced fabrication methods may not produce such voids as they may have much better gap filling processes. Thus, conventional manufacturing processes may not even be aware of such air gaps let alone the opportunity to exploit their presence.

According to various embodiments, a small dielectric constant relative to silicon dioxide, also known as a low-k requirement for device shrinking can be removed which results in less expensive manufacturing costs. According to various embodiments, a via or vias can be pre-etched and capped with a non-conformal film to seal the top, creating an air-gap. Furthermore, the film is etched, a via or vias are opened, and a dual-damascene layer is created as will be explained in more detail below.

Figure 1:
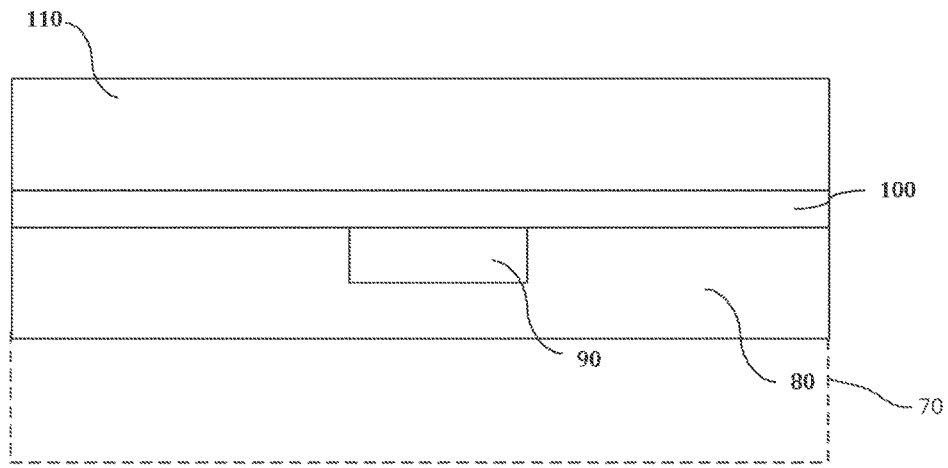
FIG. 1 shows a sectional view of parts of a semiconductor wafer with an applied barrier dielectric layer.

FIG. 1 shows the relevant parts of semiconductor wafer. A semiconductor die may comprise a metal line 90 within a top dielectric layer 80 of the semiconductor body. The following figures do not show the underlying semiconductor layers 70 in detail that comprise the active parts, but focus on the top dielectric layer 80 that includes the metal that needs to be connected through following top interconnect layers that consist of copper. Thus, these metal lines 90 may be arranged as for example shown in FIG. 1 such that a top area of the metal is exposed to be connected by the interconnect structure as follows. As shown in FIG. 1, a typical barrier dielectric layer 100 which may consist of SiN or SiC is deposited over a metal line 90. An inter-metal dielectric layer 110 which may consist of un-doped silicate glass (USG), fluorosilicate glass (FSG) or a material with a small dielectric constant relative to silicon dioxide, also known as low-k, is then deposited over layer 100.

Figure 2:
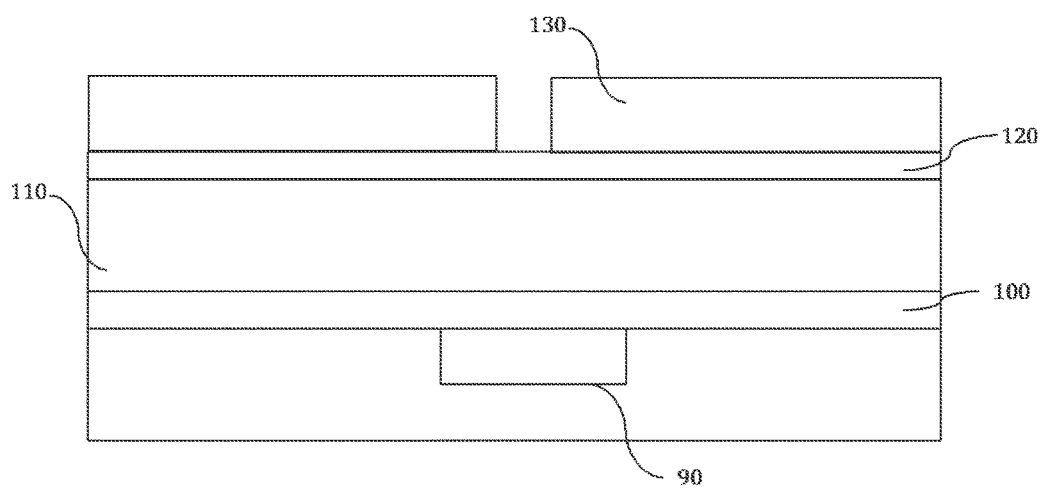
FIG. 2 shows the same as FIG. 1 after via layer is formed.
Figure 3:
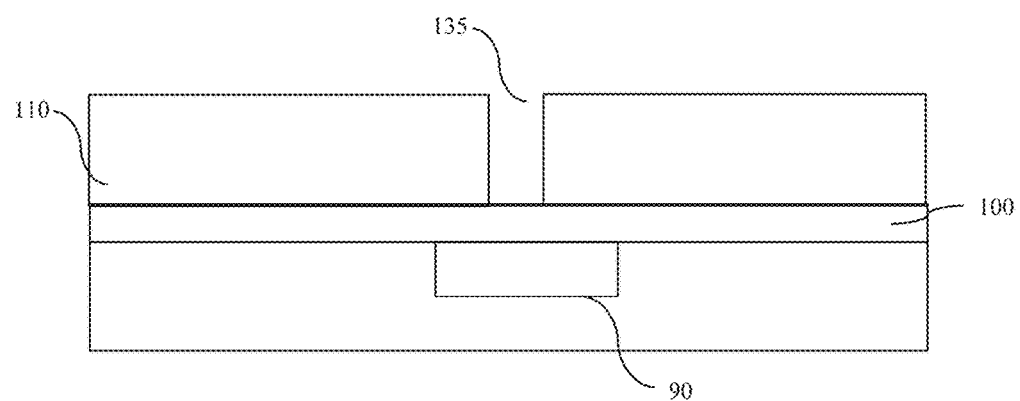
FIG. 3 shows semiconductor wafer of FIG. 2 after etching.

As shown in FIGS. 2 and 3, a via layer is printed using photolithography, typically using an anti-reflective coating 120 and photo resist layer 130 that is patterned accordingly. This via layer can, for example, be etched using a dry plasma etcher. To this end a TEL SCCM plasma etcher may be used. However, any other suitable etcher may be used. This creates a via 135 as shown in FIG. 3. The typical etch sequence involves in-situ etching of the bottom antireflective coating (BARC), oxide and resist removal, with a soft-landing endpoint that terminates the etch on or in the barrier layer 100. The process may use endpoint to provide a more accurate stopping on the barrier layer. However, other steps such as a timed process may be used.

Figure 4:
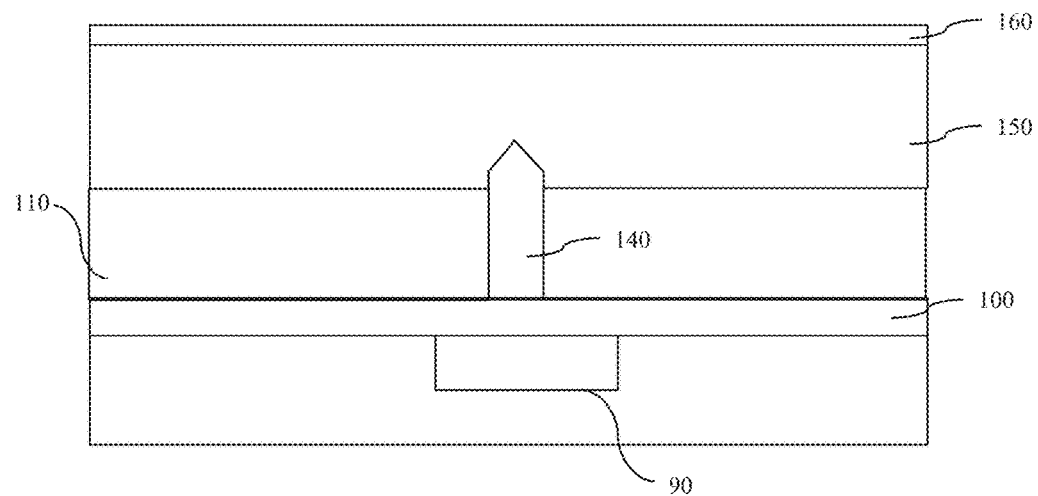
FIG. 4 shows semiconductor wafer of FIG. 3 after depositing of non-conformal film.
Figure 5:
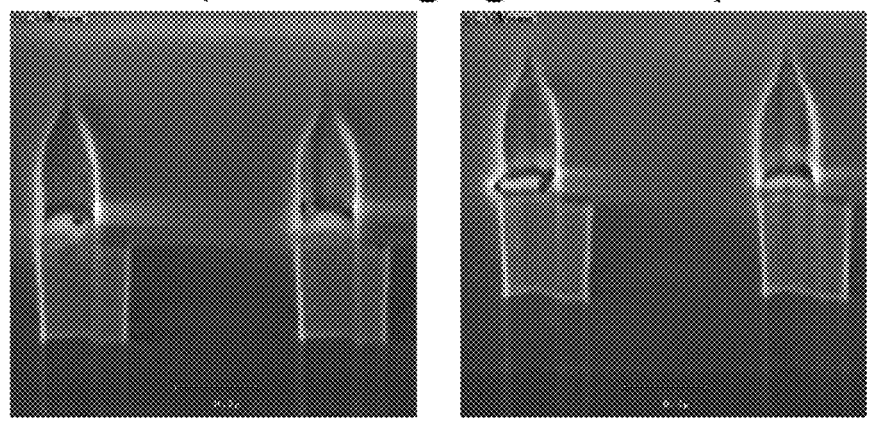
FIG. 5 shows FIB/SEM imaging of the formed void.

As shown in FIG. 4, a non-conformal dielectric layer 150, consisting, for example, of USG, FSG or low-k, is then deposited on top of the structure after the etching step is completed. This forms a void 140 in the previously etched via. The void may have the shape as shown in FIGS. 4 and 5, for example, it may be a cylindrical via with a conical shaped tip. However, other forms may be created by using other non-conformal layers. For example, the tip may be more or less pronounced.

This void formation is an essential step to assist the subsequent trench etch to form a dual-damascene structure. An actual electron microscope picture of such a structure is shown in FIG. 5.

Figure 6:
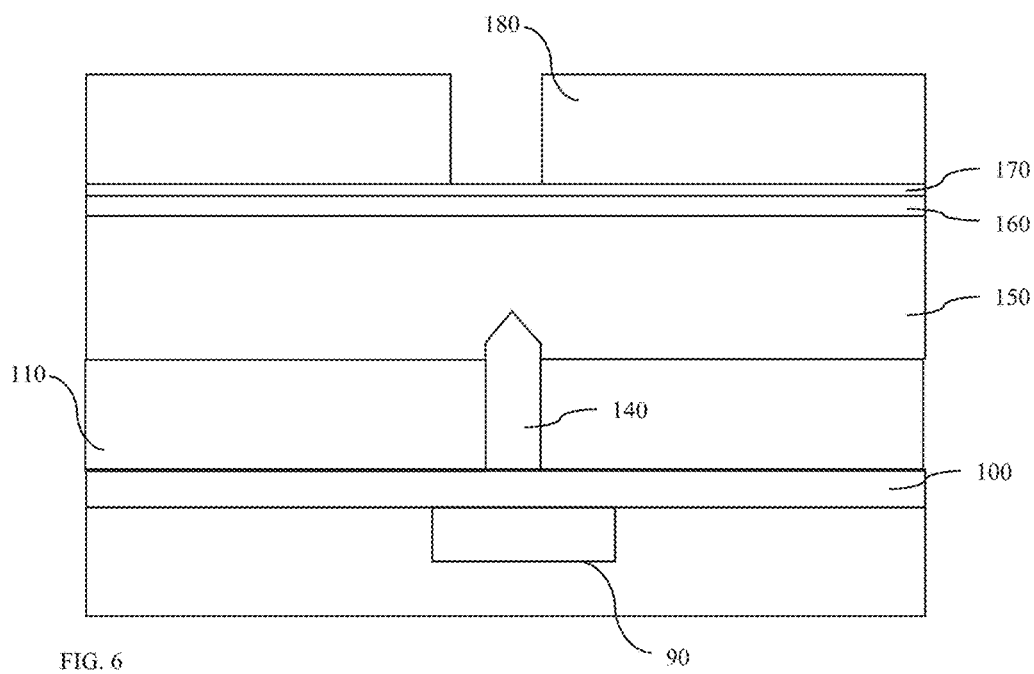
FIG. 6 shows photolithography layer deposited on top of non-conformal film.
Figure 7:
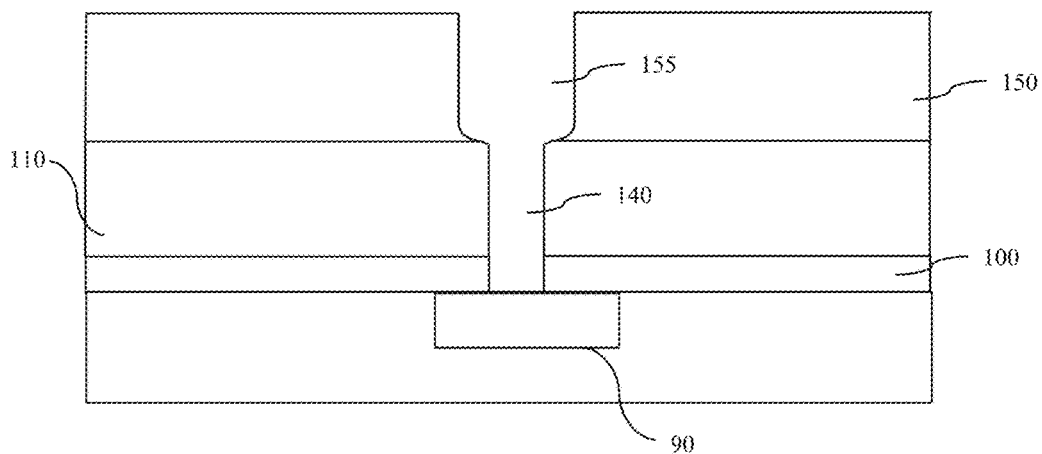
FIG. 7 shows semiconductor wafer of FIG. 6 after etching.

As shown in FIG. 6, a hard mask layer 160 is then deposited on top of layer 150, to planarize and fill any pinholes. This layer 160 will serve as an etch hard mask in subsequent steps. A metal trench layer is then printed using photolithography, typically with an anti-reflective coating 170 and photo resist 180 as shown in FIG. 6. The metal trench layer is then etched, for example, using a dry plasma etcher. Again, as stated above, e.g. a TEL SCCM etcher or any other suitable etcher may be used. The etch sequence first etches through layer 170, etches through the hard mask 160 and endpoints, initiating the oxide etch. The oxide etch defines the trench 155 as shown in FIG. 7, and etches the oxide until opening the air gap 140 that was formed. The oxide etch may be monitored with an endpoint system, or be a timed process.

As shown in FIG. 7, according to some embodiments, a certain amount of over-etching is done to clear all oxide from atop the bottom barrier layer 100. An in-situ ash process may be the next step, serving a dual purpose. The ash process removes the resist layer 180 and also cleans the bottom barrier layer in the exposed via of carbon residue. A barrier layer opening process step is immediately run following the ash, to remove the barrier at the bottom of the vias, exposing the metal line 90 beneath it. The barrier open etch step typically removes most or all of the hard mask layer 160 as well. The wafer is run through a standard front-side wet cleaning process step, for example, a diluted hydrofluoric (HF) acid cleaning step. However, any other suitable cleaning process may be used.

A conductive barrier and copper seed layer is then deposited on the wafer. This can be done according to conventional copper manufacturing processes.

Figure 8:
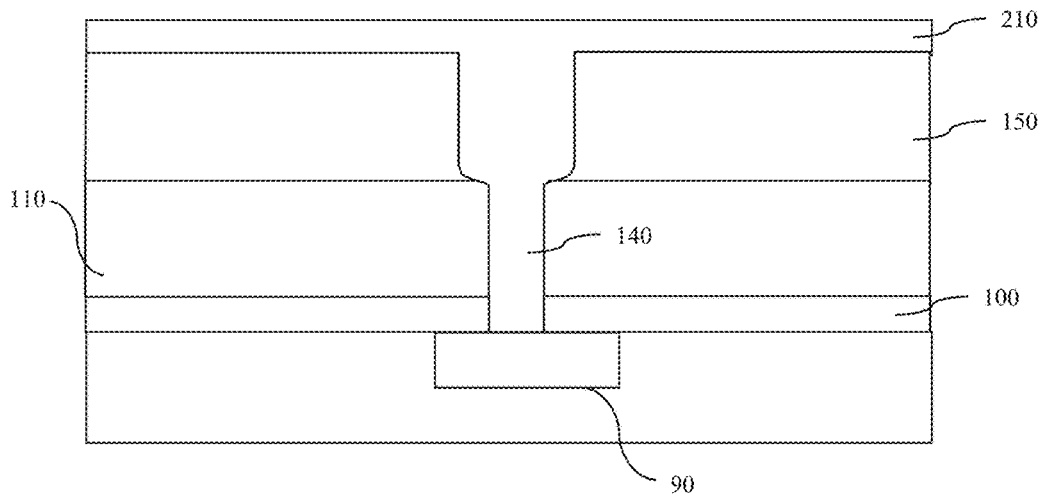
FIG. 8, shows semiconductor wafer after copper layer has been deposited.
Figure 9:
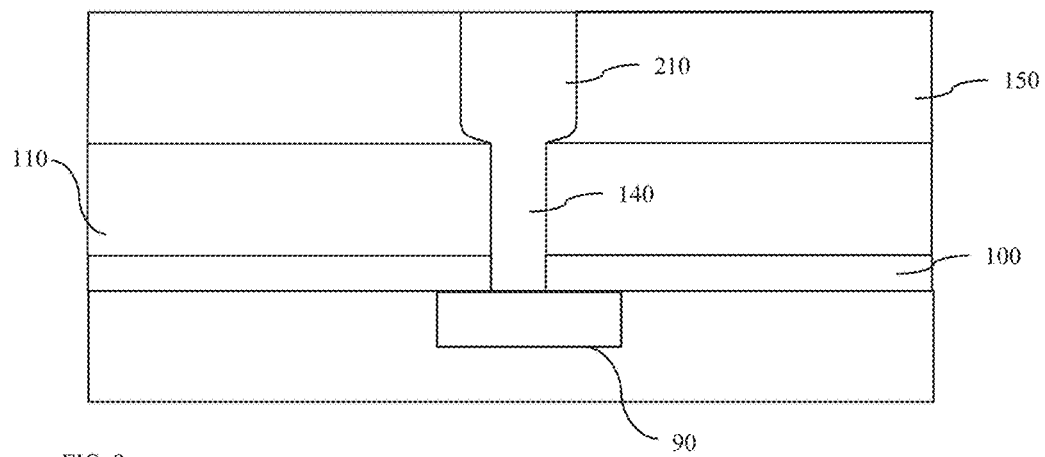
FIG. 9 shows semiconductor wafer after chemical mechanical polish (CMP) process.

As shown in FIG. 8, a copper layer 210 is then plated atop the seed layer. The copper is run through a typical copper chemical-mechanical polish (CMP) process, removing the deposited metal films. The dual damascene copper structure is now completed as shown in FIG. 9.

Figure 10:
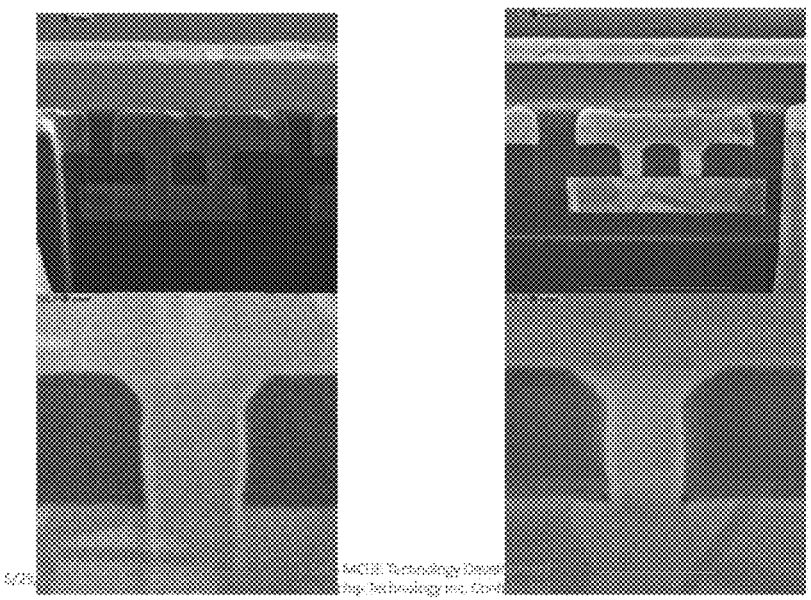
FIGS. 10-11 show FIB/SEM imaging after etching.
Figure 11:
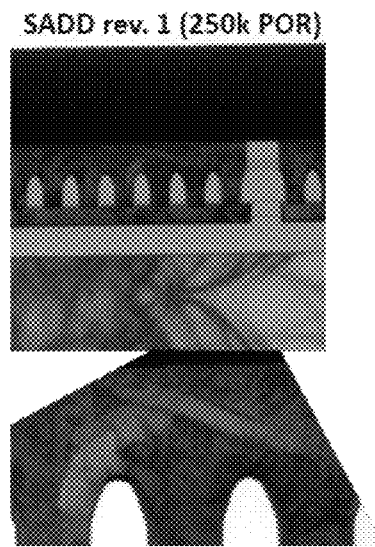
Figure 11:
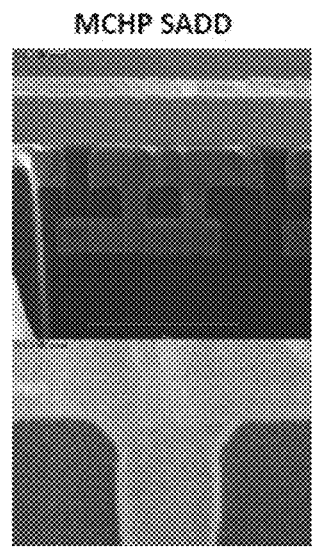

This sequence, according to various embodiments, may be repeated as many times as necessary to complete the desired number of metal layers. Benefits besides the reduced manufacturing costs are that the present technology of current generation BEOL etch tools is greatly extended, the extra capacitance to SADD is reduced or even eliminated, and via flare is reduced. FIGS. 10 and 11 show actual photographs of sectional views of a wafer.

The invention claimed is:

1. A semiconductor process for providing a metal layer, comprising:
   depositing a barrier dielectric layer on a semiconductor layer comprising an exposed metal line;
   forming a via layer on top of the barrier dielectric layer comprising at least one via;
   depositing a non-conformal film on top of the via layer thereby forming a void in the at least one via, wherein the void comprises the via in the via layer and a top space that extends into the non-conformal film; and
   etching at least one trench into the non-conformal film until an air gap is opened using an endpoint analysis, thereby opening the void, and creating a dual-damascene layer;
   wherein the etch sequence initiates an oxide etch which opens the void.

2. The semiconductor manufacturing process according to claim 1, further comprising
   depositing a copper layer on top of the dual-damascene layer and removing an overburden copper layer.

3. The semiconductor manufacturing process according to claim 1, wherein the step of depositing the copper layer comprises:
   depositing a conductive barrier layer followed by a copper seed layer.

4. The semiconductor manufacturing process according to claim 2, wherein the step of removing the overburden copper layer is performed by a chemical mechanical polish process.

5. The semiconductor manufacturing process according to claim 2, wherein prior to depositing the copper layer, the in-situ ash process is performed.

6. The semiconductor manufacturing process according to claim 5, wherein after the in-situ ash process the barrier dielectric layer is opened within the at least one via.

7. The semiconductor manufacturing process according to claim 6, wherein a front-side wet cleaning step is performed before depositing the copper layer.

8. The semiconductor manufacturing process according to claim 1, wherein the barrier dielectric layer consists of SiN or SiC.

9. The semiconductor manufacturing process according to claim 1, wherein the step of forming the via layer comprises:
 depositing an inter-metal dielectric layer on top of the barrier dielectric layer;
 depositing and patterning a process layer; and
 etching a via into the inter-metal dielectric layer up to the barrier dielectric layer.

10. The semiconductor manufacturing process according to claim 9, wherein the process layer comprises an anti-reflective coating on top of the inter-metal dielectric layer on top of which a photoresist layer is deposited and patterned.

11. The semiconductor manufacturing process according to claim 9, wherein the etching is performed with a soft-landing endpoint.

12. The semiconductor manufacturing process according to claim 9, wherein the etching is performed with a soft-landing endpoint.

13. The semiconductor manufacturing process according to claim 1, wherein the step of etching the non-conformal film comprises:
 depositing a hard mask layer on top of the non-conformal film;
 printing a trench layer using photolithography; and
 etching the trench layer.

14. The semiconductor manufacturing process according to claim 13, wherein the etching the trench layer comprises an etch sequence that etches through the trench layer and the hard mask layer.

15. The semiconductor manufacturing process according to claim 1, wherein the oxide etch is monitored by an endpoint system.

16. The semiconductor manufacturing process according to claim 1, wherein a predefined amount of over-etching is performed to clear all oxide from atop the barrier dielectric layer.

17. The semiconductor manufacturing process according to claim 1, wherein at the end of the etch sequence, a barrier etch is performed to open a bottom of the via to the metal line.

18. The semiconductor manufacturing process according to claim 1, wherein the process is repeated to form a necessary number of metal layers.

19. The semiconductor manufacturing process according to claim 1, wherein the top space of the void within the non-conformal film forms a conical shaped tip of the void.

20. The semiconductor manufacturing process according to claim 1, wherein the non-conformal film is a dielectric film comprising fluorosilicate glass (FSG).

21. A semiconductor process for providing a metal layer, comprising:
 depositing a barrier dielectric layer on a semiconductor layer comprising an exposed metal line;
 forming a via layer on top of the barrier dielectric layer comprising at least one via;
 depositing a non-conformal film on top of the via layer thereby forming a void in the at least one via, wherein the void comprises the via in the via layer and a top space that extends into the non-conformal film; and
 etching at least one trench into the non-conformal film until an air gap is opened, thereby opening the void, and creating a dual-damascene layer;
 wherein:
  the etch sequence initiates an oxide etch which opens the void;
  the oxide etch is monitored by a timed process.

* * * * *